US006755031B2

(12) United States Patent
Cho et al.

(10) Patent No.: US 6,755,031 B2
(45) Date of Patent: Jun. 29, 2004

(54) INFRARED SENSOR ASSEMBLY AND REFRIGERATOR HAVING THE INFRARED SENSOR

(75) Inventors: Seong-Ho Cho, Seoul (KR); In-Seop Lee, Gyeonggi-Do (KR); In-Won Lee, Gyeonggi-Do (KR); Jae-Yong Sung, Seoul (KR); Jay-Ho Choi, Seoul (KR); Kwang-Hyup An, Seoul (KR); Jeong-Ho Lee, Gyeonggi-Do (KR); Young-Sok Nam, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/331,875

(22) Filed: Dec. 31, 2002

(65) Prior Publication Data

US 2004/0031274 A1 Feb. 19, 2004

(30) Foreign Application Priority Data

Aug. 17, 2002 (KR) .................................. 10-2002-0048734

(51) Int. Cl.[7] .............................. F25B 49/00; G01J 5/00
(52) U.S. Cl. ........................ 62/126; 62/228.1; 374/122; 374/132; 250/338.1
(58) Field of Search ........................ 62/126, 130, 179, 62/180, 228.1; 374/121, 122, 124, 130, 132; 250/338.1, 339.03

(56) References Cited

U.S. PATENT DOCUMENTS

| 4,494,881 | A | * | 1/1985 | Everest ........................ 374/124 |
| 4,656,331 | A | * | 4/1987 | Lillquist et al. ........ 219/121 PL |
| 5,083,968 | A | * | 1/1992 | Hart ............................ 446/431 |
| 5,331,825 | A | * | 7/1994 | Kim ............................ 62/180 |
| 5,541,414 | A | * | 7/1996 | Hori ............................ 250/349 |
| 5,591,907 | A | * | 1/1997 | Stein et al. ............. 73/170.16 |
| 5,875,639 | A | * | 3/1999 | Kim et al. ................... 62/186 |
| 6,435,711 | B1 | * | 8/2002 | Gerlitz ....................... 374/130 |

* cited by examiner

*Primary Examiner*—Marc Norman
(74) *Attorney, Agent, or Firm*—Greenblum & Bernstein, P.L.C.

(57) ABSTRACT

Disclosed are an infrared sensor assembly and a refrigerator having the infrared sensor, in which a location where a heat source is generated is precisely detected by narrowing a receiving angle of an infrared sensor. To this end, the infrared sensor assembly comprises: an infrared sensor fixed to a supporting frame for receiving infrared rays generated at a heat source; a case having the infrared sensor mounted therein and an infrared filter mounted at an upper surface thereof, the infrared filter transmits only the infrared rays; and a receiving range limiting means prolonged from an outer circumference surface of the case with a predetermined height for limiting a range of the infrared rays received into the infrared sensor so as to precisely detect a location of the heat source.

15 Claims, 3 Drawing Sheets

INFRARED SENSOR ASSEMBLY AND REFRIGERATOR HAVING THE INFRARED SENSOR

BACKGROUND OF THE INVENTION

1. Field of the Invention

The present invention relates to an infrared sensor, and particularly, to an infrared sensor assembly for precisely detecting a location where a heat source is generated and a refrigerator having the infrared sensor.

2. Description of the Background Art

Generally, an infrared sensor detects physical quantity and chemical quantity such as a temperature, a pressure, and an intensity of radiation by using infrared rays having a wavelength which is longer than red light of visible rays and shorter than microwave among electromagentic waves, and converts the detected physical quantity and the chemical quantity into electricity quantity in which a signal process is possible, thereby outputting.

Especially, a thermopile infrared sensor is used as a non-contact far distance temperature measurement device which can measure a temperature of an object without directly contacting heat to the object.

FIG. 1 is a sectional view of the thermopile infrared sensor assembly in accordance with the conventional art.

The infrared sensor assembly according to the conventional art comprises: a supporting frame 102; an infrared sensor 104 fixed to the supporting frame 102 for detecting infrared rays radiated from an object; and a case 108 fixed to the supporting frame 102 and having an infrared filter 106 mounted at an upper surface thereof, the case for receiving the infrared sensor 104.

The infrared sensor 104 includes: a receiving portion 110 arranged at an upper surface thereof for detecting infrared rays radiated from the object; a fixation portion 112 for fixing the receiving portion to the supporting frame 102; and a terminal 116 connected with the receiving portion 110 by a lead line 114 for transmitting a signal value received from the receiving portion 110 to a control unit (not shown).

In the conventional infrared sensor assembly, if a heat source is generated at a predetermined point, the receiving portion 110 detects infrared rays radiated from the heat source and applies to the control unit. Then, the control unit determines a point where the heat source is generated and a temperature of the heat source. At this time, the infrared filter 106 transmits only the infrared rays, thereby measuring more precisely.

However, in the conventional infrared sensor assembly, since a receiving angle (θ) taken to the receiving portion is wide as approximately 60°, it is easy to detect whether the heat source is generated or not, but it is difficult to measure a precise point where the heat source is generated.

SUMMARY OF THE INVENTION

Therefore, an object of the present invention is to provide an infrared sensor assembly which can precisely measure a location of the heat source by narrowing a receiving range of the infrared sensor.

Also, another object of the present invention is to provide a refrigerator to which the infrared sensor is applied, in which a location where a high temperature load inside the refrigerator is generated is precisely detected by narrowing a receiving angle of the infrared sensor mounted in the refrigerator.

To achieve these and other advantages and in accordance with the purpose of the present invention, as embodied and broadly described herein, there is provided an infrared sensor assembly comprising: an infrared sensor fixed to a supporting frame for receiving infrared rays generated at a heat source; a case having the infrared sensor mounted therein and an infrared filter mounted at an upper surface thereof, the infrared filter transmits only the infrared rays; and a receiving range limiting means prolonged from an outer circumference surface of the case with a predetermined height for limiting a range of the infrared rays received into the infrared sensor so as to precisely detect a location of the heat source.

The receiving range limiting means includes: a housing mounted outside of the case and formed above an upper surface of the case with a predetermined height; and an infrared lens mounted at an upper surface of the housing for limiting a receiving range of the infrared rays generated at the heat source.

The housing of the receiving range limiting means formed as a cylindrical shape having a predetermined length includes a mounting groove to which an outer circumference surface of the supporting frame is fixed at a bottom inner circumference surface thereof; and the infrared lens mounted at an upper surface thereof.

A diameter of the infrared lens 24 of the receiving range limiting means is differently set according to a receiving range of the infrared rays generated from the heat source.

The infrared lens 24 of the receiving range limiting means is made of chalcogenide based glass.

The infrared lens 24 of the receiving range limiting means is formed to limit a receiving angle from the heat source as about 5°.

The infrared lens 24 of the receiving range limiting means is provided with a height control means for controlling a height of the housing divided into an upper housing and a lower housing.

The height control means includes a female thread formed at an inner circumference surface of the upper housing and a male thread formed at an outer circumference surface of the lower housing. At this time, the female thread and the male thread are engaged to rotate the upper housing, thereby controlling a height of the housing.

A refrigerator having the infrared sensor according to the present invention comprises: a body divided into a freezing chamber and a chilling chamber by a partition wall and having a predetermined space to store food; a fan attached to an upper portion of the freezing chamber for forcibly circulating cool air cooled by passing the freezing cycle; a cool air discharge duct for discharging cool air blown by the fan into the chilling chamber; infrared sensors mounted at an inner wall of the chilling chamber for detecting a temperature and a generation location of a high temperature load by receiving infrared rays generated at the high temperature load; and a receiving range limiting means mounted at an upper portion of the infrared sensor with a predetermined interval for limiting a receiving range of the infrared rays received into the infrared sensor so as to precisely detect a location where the high temperature load is generated.

The receiving range limiting means is mounted at an outer portion of the infrared sensor mounted at an inner wall of the chilling chamber, and includes a housing formed above the infrared sensor with a predetermined height; and an infrared lens mounted at an upper surface of the housing for limiting a receiving range of the infrared rays generated at the high temperature load.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

An infrared sensor assembly and a refrigerator having the infrared sensor will be explained with reference to preferred embodiments.

Figure 1:
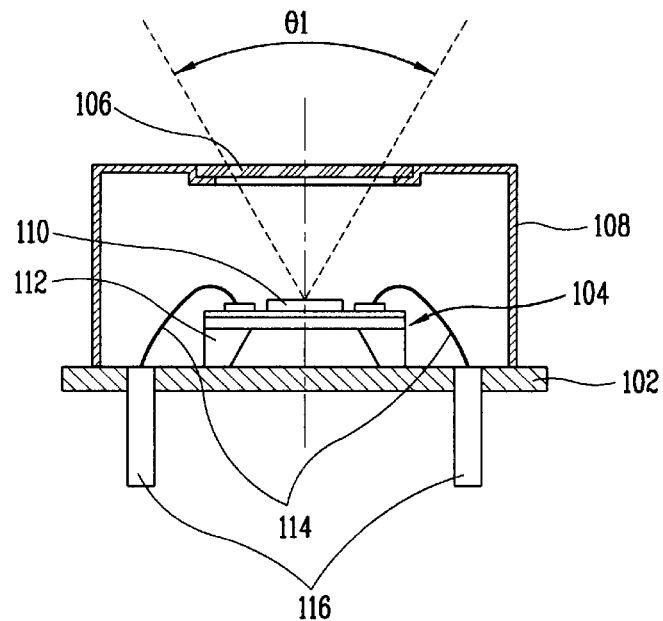
FIG. 1 is a sectional view of an infrared sensor according to the conventional art.
Figure 2:
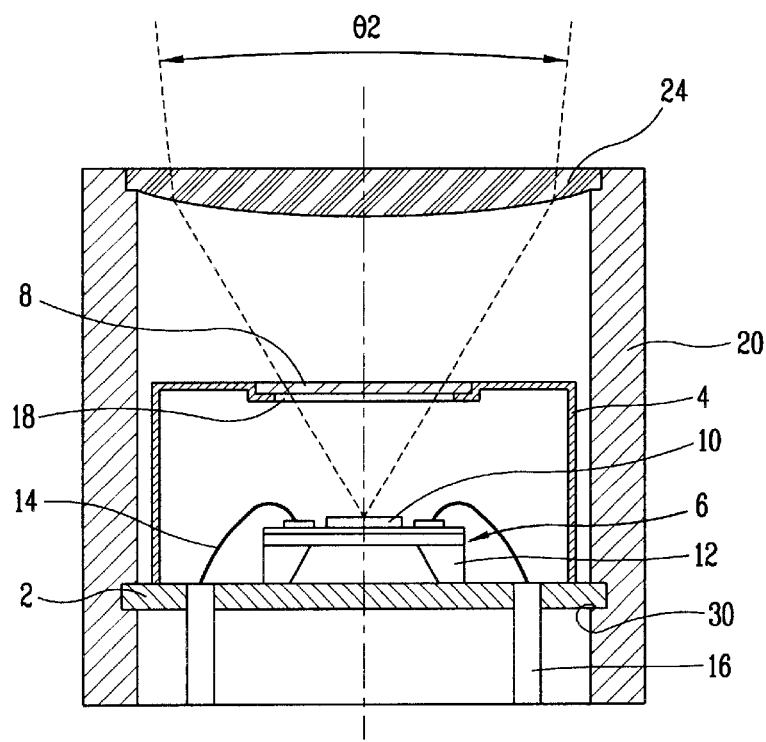
FIG. 2 is a sectional view of an infrared sensor assembly according to one preferred embodiment of the present invention.

FIG. 2 is a sectional view of an infrared sensor assembly according to the present invention.

The infrared sensor assembly according to the present invention comprises: a supporting frame 2; a case 4 fixed at an upper surface of the supporting frame 2 and having an opened upper surface; an infrared sensor 6 attached to the upper surface of the supporting frame 2 and mounted in the case 4 for receiving infrared rays emitted from a heat source; an infrared filter 8 mounted at the open upper surface of the case 4 for transmitting only the infrared rays; and a receiving range limiting means installed at an outer portion of the case 4 for limiting a receiving range of the infrared rays received into the infrared sensor 6.

The infrared sensor 6 includes: a receiving portion 10 for receiving infrared rays generated from the heat source; and a fixation portion 12 fixed to the supporting frame 2 for supporting the receiving portion 10; and a terminal 16 fixed to the supporting frame 2 and connected by the receiving portion 10 and the lead line 14 for sending a signal value received from the receiving portion 10 to a control unit (not shown).

The case 4 is fixed to the upper surface of the supporting frame 2 as a cylindrical shape and is provided with a through hole 18 to which the infrared filter 8 is mounted at an upper side thereof.

The receiving range limiting means includes: a housing 20 mounted to an outer circumference of the case 4 and formed above the case with a predetermined height; and an infrared lens 24 mounted at an upper surface of the housing 20 for limiting a receiving range of the infrared rays generated at the heat source according to its diameter.

The housing 20 is arranged to an outer circumference surface of the case 4 as a cylindrical shape having a predetermined length and limits a receiving angle of the infrared rays by being prolonged to an upper direction of the infrared sensor 6 with a predetermined length. At this time, an upper surface of the housing is opened so that the infrared lens 24 can be attached. Also, a fixation groove 30 to which an outer circumference surface of the supporting frame 2 is fixed is formed at a bottom inner circumference surface of the housing 20 as a circumference direction.

The infrared lens 24 fixed to an upper surface of the housing 20 refracts infrared rays generated at the heat source to the infrared sensor 6 and limits a receiving range of the infrared rays, so that the infrared sensor 6 can precisely detect a location of the heat source.

The infrared lens 24 can control the receiving range of the infrared rays according to its diameter. That is, when the infrared rays generated at the heat source is applied to the infrared sensor 6 through the infrared lens 24, if the diameter of the infrared lens 24 becomes greater, an area to which the infrared rays is received becomes wide, so that a receiving range of the infrared rays becomes wide, and vice versa. At this time, the receiving range ($\theta 2$) for the infrared rays of the infrared rays lens 24 is preferably set as 5°.

A scan region of the heat source is set on the basis of a distance between the heat source and the infrared rays lens 24, thereby determining a diameter of the infrared rays lens 24. For example, in order to detect a location of the heat source more precisely, the scan region of the heat source is set to be smaller, and in order to detect whether a wide heat source is generated or not, the scan region of the heat source is set to be larger. Herein, the diameter of the infrared rays lens 24 has to be equal to that of the infrared rays filter 8 or larger than that of the infrared rays filter 8.

Operations of the infrared rays assembly according to the present invention will be explained.

If the heat source is generated at a predetermined spot, the infrared sensor 6 receives infrared rays generated at the heat source, thereby detecting a temperature and a location of the heat source.

That is, if the infrared lens 24 refracts the receiving range ($\theta 2$) of the infrared rays generated from the heat source to the infrared sensor 6 by limiting as about 5°, a signal value of the infrared rays received into the infrared lens 24 is applied to a control unit (not shown) through a lead line 14 and a terminal 16. Then, the control unit analyzes the signal value and thereby detects a temperature and a generation location of the heat source.

At this time, infrared rays more than a predetermined receiving range is shielded by the housing 20 and infrared rays within the predetermined receiving range is transmitted only by the infrared lens 24. Therefore, since the receiving range of the infrared rays is determined only by the receiving range of the infrared lens 24, the location of the heat source can be precisely detected.

At this time, the receiving range of the infrared rays can be controlled by changing a distance between the heat source and the infrared sensor 6 and a diameter of the infrared lens 24 by external factors and the user's selection.

Figure 3:
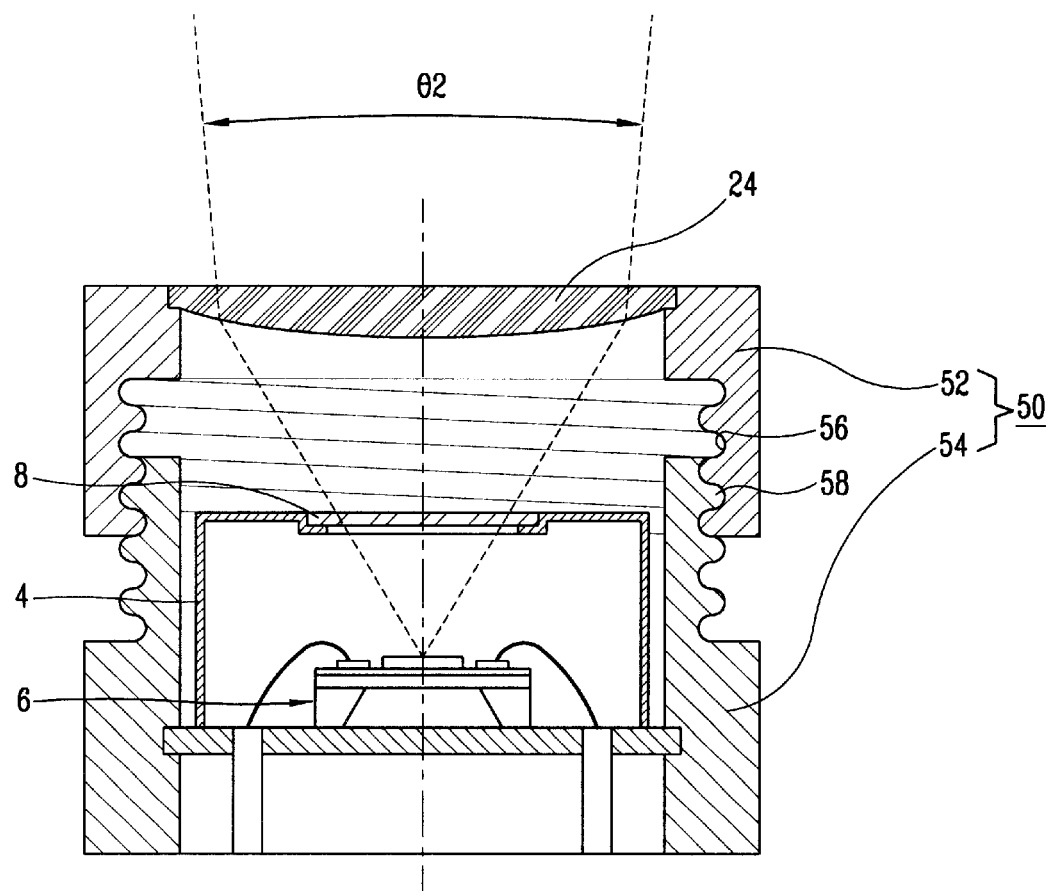
FIG. 3 is a sectional view of the infrared sensor assembly according to another preferred embodiment of the present invention.

FIG. 3 is a sectional view of the infrared sensor assembly according to another embodiment of the present invention.

The infrared sensor assembly according to said another embodiment comprises: an infrared sensor 6 fixed to a supporting frame 2 for receiving infrared rays generated at the heat source; a case 4 having the infrared sensor 6 mounted therein and an infrared filter 8 mounted at an upper side thereof; a housing 50 arranged at an outer circumference surface of the case 4; an infrared lens 24 fixed to an upper surface of the housing 50; and a height control means for controlling a height of the housing 50.

Since the infrared sensor 6, the case, and the infrared lens 24 have the same constructions and the operations explained in the first embodiment, their detail explanations will be omitted.

The housing 50 includes an upper housing 52 to which the infrared lens 24 is mounted; a lower housing 54 arranged at an outer circumference surface of the case 4; a height control means formed between the upper housing 52 and the lower housing 54 for controlling a height of the housing 50.

The height control means includes a female thread 56 formed at an inner circumference surface of the upper housing 52 and a male thread 58 formed at an outer circumference surface of the lower housing 54. That is, if the upper housing 52 is rotated to a normal or a reverse direction, the upper housing 52 goes up and down by an interaction between the female thread 56 and the male thread 58, thereby controlling the height of the housing 50.

Herein, the height control means can control the height of the housing 50 by forming the male thread at an outer circumference surface of the upper housing 52 and forming the female thread at an inner circumference surface of the lower housing 54.

The infrared sensor assembly according to the second preferred embodiment adjusts a distance between the infrared lens 24 and the infrared sensor 6 by controlling a height of the housing 50 by the height control means and controls the receiving range of infrared rays generated at the heat source. That is, by controlling the infrared lens 24 up and down, a distance between the heat source and the infrared lens 24 is controlled, and by controlling the receiving range of infrared rays passing the infrared lens 24, the receiving range of infrared rays received into the infrared sensor 6 is controlled.

Figure 4:
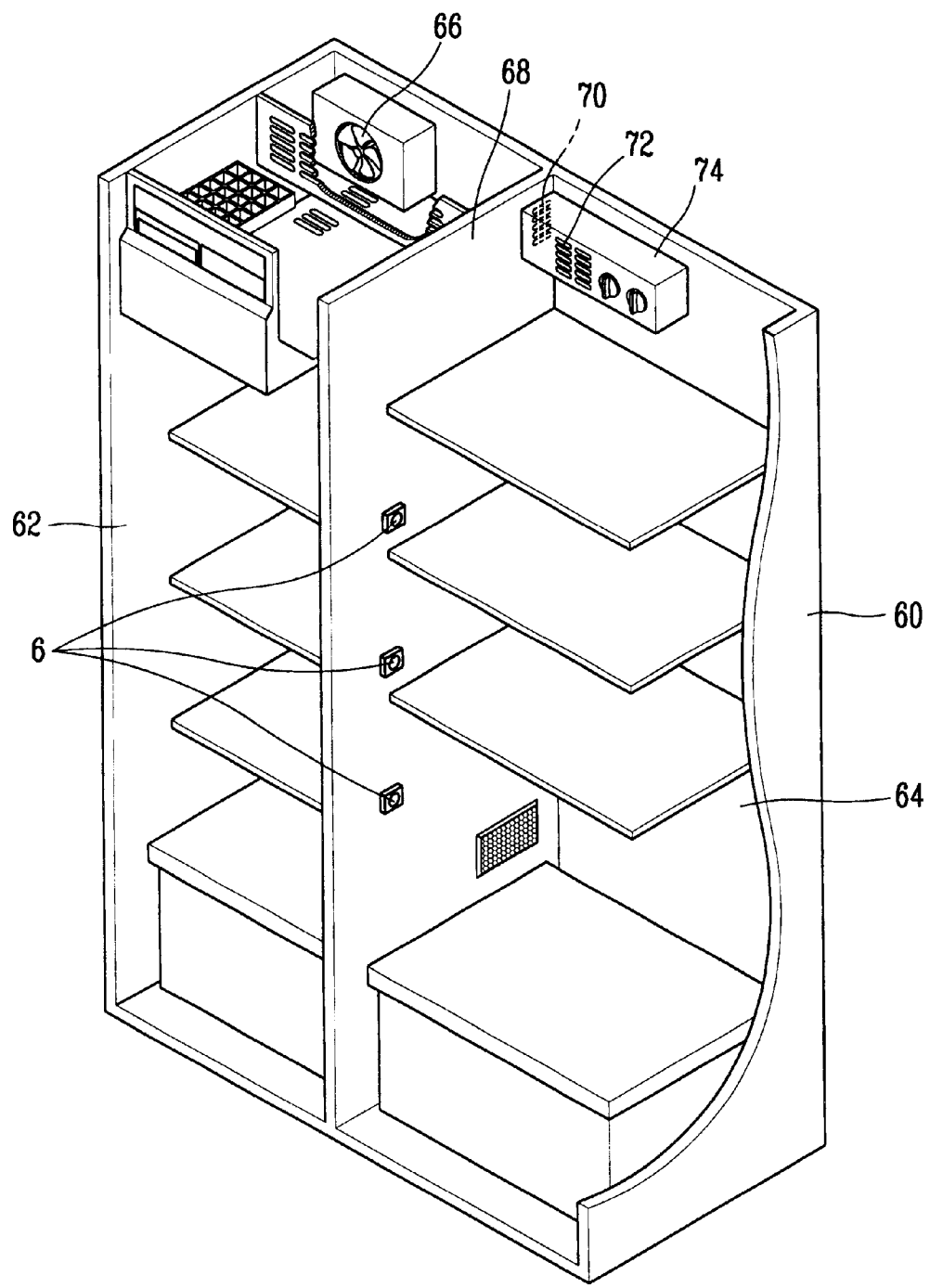
FIG. 4 is a sectional view of a refrigerator to which the infrared sensor according to the present invention is applied.

FIG. 4 is a sectional view of a refrigerator having the infrared sensor according to the present invention.

The refrigerator having the infrared sensor comprises: a body 60 having a predetermined space to store food; a fan 66 attached to an upper back wall side of the freezing chamber 62 arranged on the right of the body 60 for forcibly circulating cool air cooled by passing the freezing cycle; a cool air supply passage 70 formed at an upper side of a partition wall 68 which divides the freezing chamber 62 and a chilling chamber 64 for supplying cool air blown by the fan 66 to the chilling chamber 64; a cool air discharge duct 74 connected to the cool air supply passage 70, and installed at an upper side of the chilling chamber 64 and provided with cool air discharging holes 72 for discharging the cool air into the chilling chamber 64; infrared sensors 6 mounted at an inner wall of the chilling chamber 64 for detecting a temperature and a generation location of a high temperature load by receiving infrared rays generated at the high temperature load; and a receiving range limiting means mounted at an upper surface of the infrared sensors 6 with a predetermined interval for limiting a receiving range of the infrared rays received into the infrared sensors 6 so as to precisely detect a location where the high temperature load is generated.

Herein, the infrared sensor 6 has the same construction and operation with those of the infrared sensor explained in the first embodiment, thereby omitting its explanation.

The receiving range limiting means is mounted at an outer portion of the infrared sensor 6 mounted at an inner wall of the chilling chamber 64, and includes a housing 20 formed above the infrared sensor 6 with a predetermined height; and an infrared lens 24 mounted at an upper surface of the housing 20 for limiting a receiving range of the infrared rays generated at the high temperature load.

The housing 20 and the infrared lens 24 have the same constructions and operations with those explained in said preferred embodiments, thereby omitting their explanations.

The infrared sensor assembly according to the present invention and the refrigerator having the infrared sensor have the following advantages.

The receiving range of the infrared rays received into the infrared sensor is limited by installing the housing having a predetermined height at an outer circumference surface of the infrared sensor and by mounting the infrared lens which limits the receiving range of the infrared rays generated at the heat source at an upper surface of the housing, thereby precisely detecting a location where the heat source is generated.

Also, by installing the receiving range limiting means at an outer portion of the infrared sensor mounted in the refrigerator, a location where the high temperature load in the refrigerator is generated is precisely detected, thereby having a fast cooling performance.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An infrared sensor assembly comprising:
    an infrared sensor fixed to a supporting frame that receives infrared rays generated at a heat source;
    a case having the infrared sensor mounted therein and an infrared filter mounted at an upper surface thereof, the infrared filter transmits only the infrared rays; and
    a receiving range limiting device provided about an outer circumference surface of the case with a predetermined height that limits a range of the infrared rays received into the infrared sensor so as to precisely detect a location of the heat source,
    wherein the receiving range limiting device includes:
        a housing mounted outside the case and formed above an upper surface of the case with a predetermined height; and
        an infrared lens mounted at an upper surface of the housing that limits a receiving range of infrared rays generated at the heat source.

2. The infrared sensor assembly of claim 1, wherein the housing is formed as a cylindrical shape having a predetermined length includes a mounting groove to which an outer circumference surface of the supporting frame is fixed at a bottom inner circumference surface thereof; and the infrared lens is mounted at an upper surface thereof.

3. The infrared sensor assembly of claim 1, wherein a diameter of the infrared lens is differently set according to a receiving range of the infrared rays generated from the heat source.

4. The infrared sensor assembly of claim 1, wherein the infrared lens is made of chalcogenide based glass.

5. The infrared sensor assembly of claim 1, wherein the infrared lens is formed to be able to limit a receiving angle from the heat source as about 5°.

6. The infrared sensor of claim 1, wherein the housing is provided with a height control device that controls the height of the housing.

7. The infrared sensor of claim 6, wherein the housing is divided into an upper housing and a lower housing and the height control device includes:
- a female thread formed at an inner circumference surface of the upper housing; and
- a male thread formed at an outer circumference surface of the lower housing, in which the female thread and the male thread are engaged to rotate the upper housing, thereby controlling a height of the housing.

8. The infrared sensor of claim 6, wherein the height control device includes a male thread formed at an inner circumference surface of the upper housing and a female thread formed at an outer circumference surface of the lower housing, in which the female thread and the male thread are engaged to rotate the upper housing, thereby controlling a height of the housing.

9. A refrigerator having an infrared sensor, the refrigerator comprising:
- a body divided into a freezing chamber and a chilling chamber by a partition wall and having a predetermined space to store food;
- a fan attached to an upper portion of the freezing chamber that forcibly circulates cool air cooled by passing the freezing cycle;
- a cool air discharge duct that discharges cool air blown by the fan into the chilling chamber;
- a plurality of infrared sensors mounted at an inner wall of the chilling chamber hat detect a temperature and a generation location of a high temperature load by receiving infrared rays generated at the high temperature load; and
- a receiving range limiting device mounted at an upper portion of the infrared sensor with a predetermined interval that limits a receiving range of the infrared rays received into the infrared sensor so as to precisely detect a location where the high temperature load is generated.

10. The refrigerator of claim 9, wherein the receiving range limiting device is mounted at an outer portion of the infrared sensors mounted at an inner wall of the chilling chamber, and includes:
- a housing formed above an upper surface of the infrared sensor with a predetermined height; and
- an infrared lens mounted at an upper surface of the housing that limits a receiving range of the infrared rays generated at the high temperature load.

11. The refrigerator of claim 10, wherein the housing is formed as a cylindrical shape having a predetermined length and includes the infrared lens mounted at an upper surface thereof.

12. The refrigerator of claim 10, wherein a diameter of the infrared lens is differently set according to a receiving range of the infrared rays generated from the high temperature load.

13. The refrigerator of claim 10, wherein the infrared lens is made of chalcogenide based glass.

14. The refrigerator of claim 10, wherein the housing is provided with a height control device at one side thereof for controlling a height of the housing.

15. The refrigerator of claim 14, wherein the housing is divided into an upper housing and a lower housing, and the height control device includes:
- a female thread formed at an inner circumference surface of the upper housing; and
- a male thread formed at an outer circumference surface of the lower housing, in which the female thread and the male thread are engaged to rotate the upper housing, thereby controlling a height of the housing.

\* \* \* \* \*

UNITED STATES PATENT AND TRADEMARK OFFICE
CERTIFICATE OF CORRECTION

PATENT NO.    : 6,755,031 B2
DATED         : June 29, 2004
INVENTOR(S)   : S. Cho et al.

It is certified that error appears in the above-identified patent and that said Letters Patent is hereby corrected as shown below:

Column 7,
Line 31, "hat" should be -- that --.

Signed and Sealed this

Fifteenth Day of February, 2005

JON W. DUDAS
*Director of the United States Patent and Trademark Office*